(12) United States Patent
Milkov

(10) Patent No.: US 9,325,335 B1
(45) Date of Patent: Apr. 26, 2016

(54) COMPARATOR CIRCUITS WITH LOCAL RAMP BUFFERING FOR A COLUMN-PARALLEL SINGLE SLOPE ADC

(71) Applicant: TELEDYNE SCIENTIFIC & IMAGING, LLC, Thousand Oaks, CA (US)

(72) Inventor: Mihail M. Milkov, Moorpark, CA (US)

(73) Assignee: TELEDYNE SCIENTIFIC & IMAGING, LLC, Thousand Oaks, CA (US)

(*) Notice: Subject to any disclaimer, the term of this patent is extended or adjusted under 35 U.S.C. 154(b) by 0 days.

(21) Appl. No.: 14/523,179

(22) Filed: Oct. 24, 2014

(51) Int. Cl.
| H03M 1/06 | (2006.01) |
| H03M 1/00 | (2006.01) |
| H03K 4/90 | (2006.01) |
| H03K 3/0233 | (2006.01) |
| H03M 1/12 | (2006.01) |
| H03M 1/36 | (2006.01) |

(52) U.S. Cl.
CPC ............. *H03M 1/002* (2013.01); *H03K 3/0233* (2013.01); *H03K 4/90* (2013.01); *H03M 1/0607* (2013.01); *H03M 1/1245* (2013.01); *H03M 1/368* (2013.01)

(58) Field of Classification Search
CPC ......... H04N 5/335; H04N 3/14; H03M 1/002; H03M 1/0607; H03K 4/90
USPC .......... 341/144, 155, 169, 167, 168; 348/294, 348/302, 301
See application file for complete search history.

(56) References Cited

U.S. PATENT DOCUMENTS

| | | | |
|---|---|---|---|
| 5,084,704 A | 1/1992 | Parrish | 341/164 |
| 6,956,413 B2 | 10/2005 | Bailey | 327/131 |
| 7,274,319 B2 | 9/2007 | Lee | 341/155 |
| 7,609,756 B2 * | 10/2009 | Wood | G04F 10/005 331/17 |
| 8,169,517 B2 * | 5/2012 | Poonnen | H03M 1/123 348/294 |
| 8,294,607 B2 * | 10/2012 | Rao | H03M 1/123 341/155 |
| 8,395,539 B2 * | 3/2013 | Lim | H03M 1/0607 341/155 |
| 8,462,246 B2 * | 6/2013 | Lee | H04N 5/3575 341/122 |
| 8,624,769 B2 | 1/2014 | Wrigley et al. | 341/155 |
| 8,686,341 B2 * | 4/2014 | Noiret | H04N 5/35536 348/308 |
| 8,724,001 B2 | 5/2014 | Ay | 348/308 |
| 8,766,843 B2 | 7/2014 | Ueno | 341/169 |
| 8,823,575 B2 * | 9/2014 | Hagihara | G04F 10/005 341/145 |
| 2006/0125673 A1 | 6/2006 | Lee | 341/155 |
| 2007/0008206 A1 | 1/2007 | Tooyama et al. | 341/155 |
| 2013/0258157 A1 | 10/2013 | Nam et al. | 348/311 |
| 2014/0036124 A1 | 2/2014 | Higuchi et al. | 348/302 |

* cited by examiner

*Primary Examiner* — Peguy Jean Pierre
(74) *Attorney, Agent, or Firm* — Koppel, Patrick, Heybl & Philpott

(57) ABSTRACT

A comparator circuit suitable for use in a column-parallel single-slope analog-to-digital converter comprises a comparator, an input voltage sampling switch, a sampling capacitor arranged to store a voltage which varies with an input voltage when the sampling switch is closed, and a local ramp buffer arranged to buffer a global voltage ramp applied at an input. The comparator circuit is arranged such that its output toggles when the buffered global voltage ramp exceeds the stored voltage. Both DC- and AC-coupled comparator embodiments are disclosed.

30 Claims, 5 Drawing Sheets

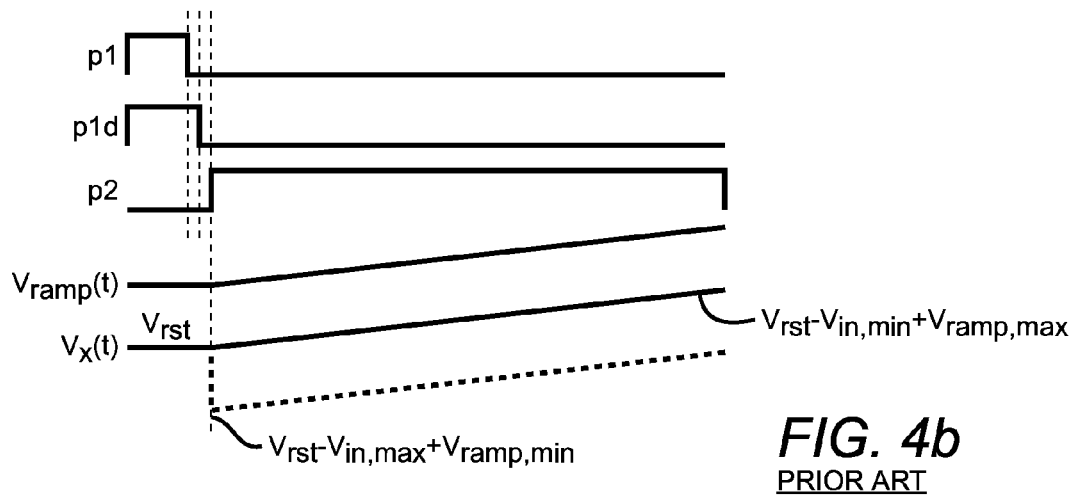
FIG. 4b
PRIOR ART
FIG. 5b
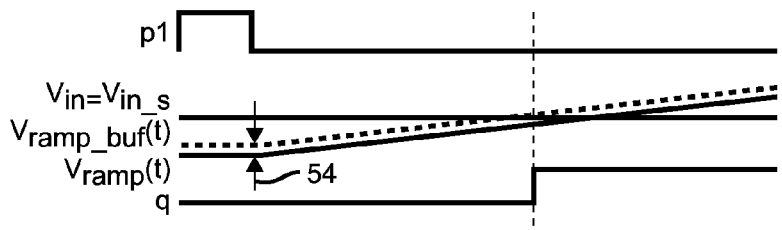
FIG. 6a
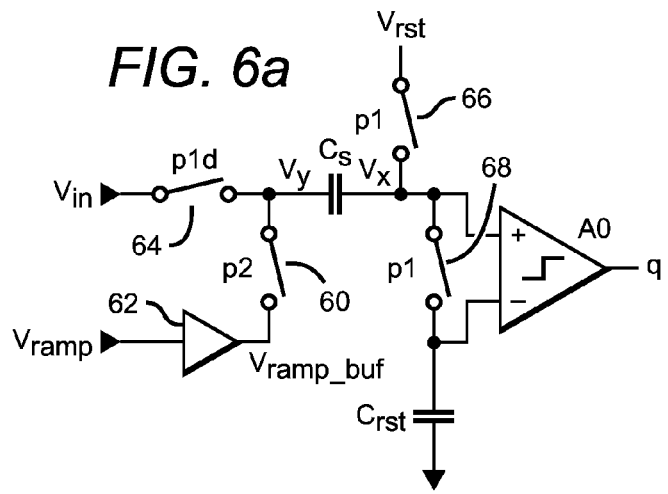
FIG. 7
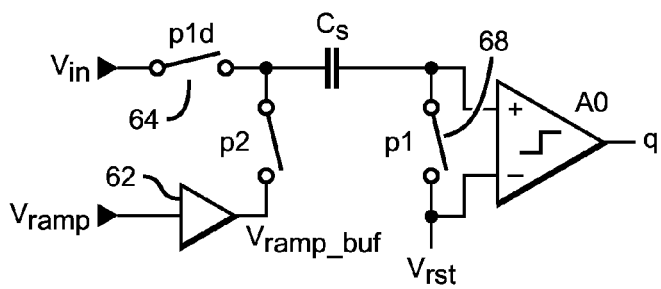

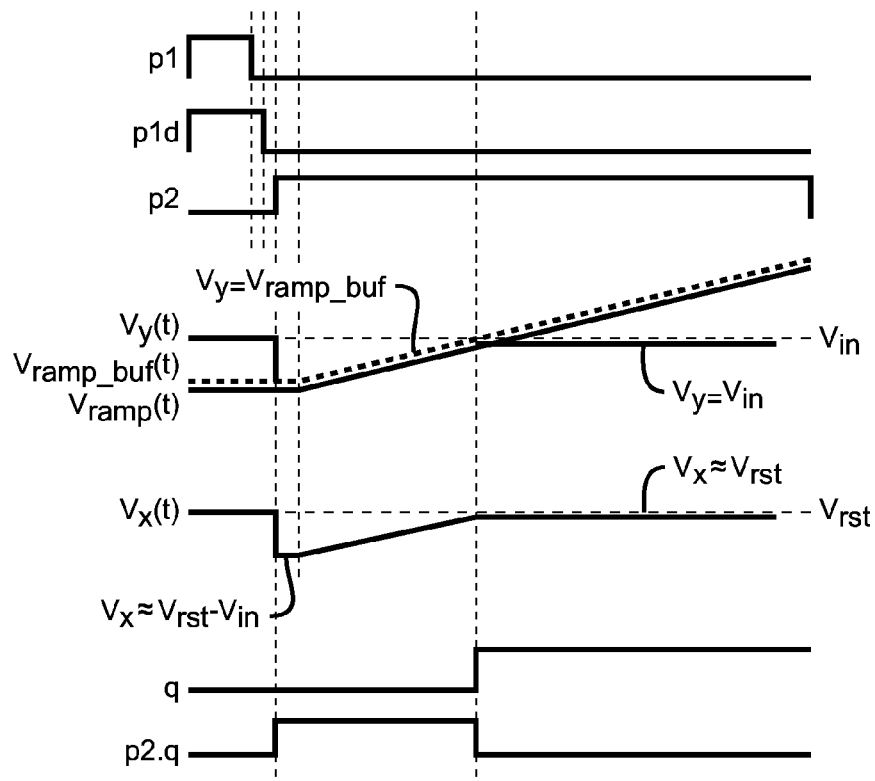
FIG. 9b
FIG. 10
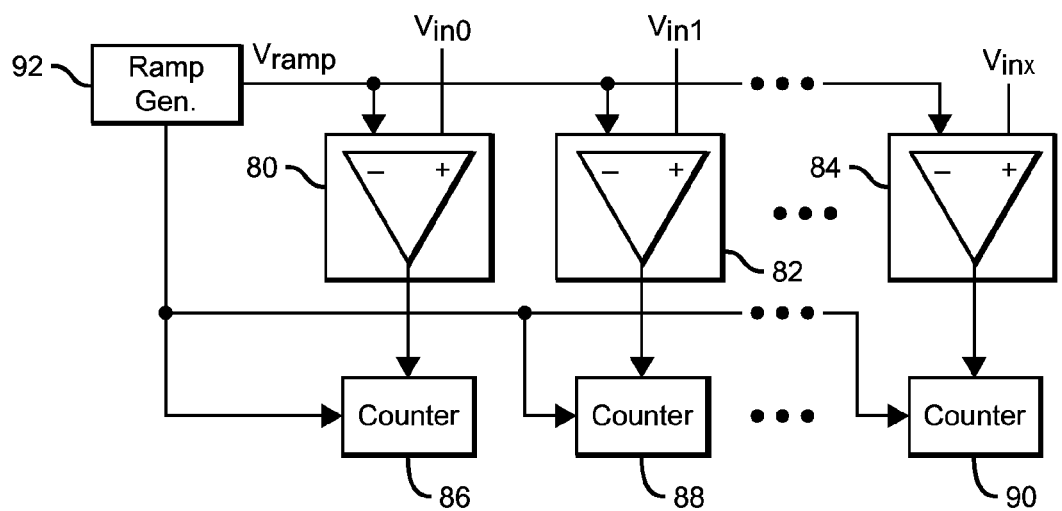

COMPARATOR CIRCUITS WITH LOCAL RAMP BUFFERING FOR A COLUMN-PARALLEL SINGLE SLOPE ADC

GOVERNMENT LICENSE RIGHTS

This invention was made with Government support under Contract DE-AC04-94AL85000 awarded by the Department of Energy. The Government has certain rights in the invention.

BACKGROUND OF THE INVENTION

1. Field of the Invention

This invention relates generally to comparator circuits, and more particularly to comparator circuits used in column-parallel single-slope analog-to-digital converters (ADCs).

2. Description of the Related Art

Image sensors generally include an array of pixels arranged in columns and rows. One common approach to reading out the voltages produced by the pixels in each column is to use column-parallel single-slope ADCs. A typical arrangement is shown in FIG. 1. A voltage from each column, $V_{in0}, V_{in1}, \ldots, V_{inx}$ is provided to one input of respective comparators A0, A1, ..., Ax, each of which also receives a shared (or 'global') voltage ramp $V_{ramp}$ produced by a ramp generator 10. During each row readout period, $V_{ramp}$ increases linearly and covers the full input signal range. The output of each comparator will toggle when $V_{ramp}$ exceeds its column voltage ($V_{in0}, V_{in1}, \ldots, V_{inx}$). The system typically includes a common counter 12, and the columns typically include respective memory locations 14, 16, 18; when the output of each column's comparator toggles, the current counter value is stored in the column's memory location and is a digital representation of the column voltage. Note that a comparator and a memory location are located in each column.

As noted above, each comparator receives a common ramp voltage $V_{ramp}$. A basic ramp generator 10 is shown in FIG. 2. A capacitor $C_{ramp}$ is connected to a constant current source 20 via a switch 22 operated with an enable signal 'en', and to a potential such as ground via a switch 24 operated with a reset signal 'rst'. In operation, closing switch 22 causes $V_{ramp}$ to start increasing linearly, and closing switch 24 causes $V_{ramp}$ to reset to ground (assuming switch 24 is connected to ground).

Several types of comparator circuits are used in column-parallel single-slope ADCs. An example of a "DC-coupled" comparator circuit is shown in FIG. 3. The column voltage ($V_{in}$) is connected to one input of the comparator A0 via a switch 30 operated with a control signal p1, with a sampling capacitor $C_s$ connected between the comparator input and ground; global voltage ramp $V_{ramp}$ is connected to the other comparator input. In operation, switch 30 is briefly closed such that $V_{in}$ is stored on $C_s$. When $V_{ramp}$ increases such that it exceeds the stored voltage, the output of A0 toggles.

However, there are several problems with this arrangement. One issue is that the comparator's operating point at the instant when it toggles changes depending on the value of $V_{in}$. As a result, the propagation delay through the comparator will vary with $V_{in}$, leading to ADC non-linearity. Another source of non-linearity is the input-dependent charge injection of switch 30, which leads to non-linearity of the sampled input signal. A third issue is that the capacitive load on $V_{ramp}$ will vary with the ramp voltage as the operating point of the comparator changes. This affects the linearity of a ramp generated by a circuit such as that shown in FIG. 2 and consequently the ADC linearity. A fourth issue is that when the comparator output toggles, there is charge kickback on the shared ramp that can give rise to column-to-column crosstalk effects.

An example of an "AC-coupled" comparator circuit is shown in FIG. 4a, and a timing diagram which illustrates the operation of the circuit is shown in FIG. 4b. The column voltage ($V_{in}$) is connected to one side of a switch 40 operated with a control signal p1d, with a sampling capacitor $C_s$ connected between the other side of the switch and one of the inputs of comparator A0. A reset capacitor $C_{rst}$ is connected to the other comparator input, which is initialized to a voltage $V_{rst}$ via switches 42 and 44, each of which is operated with a control signal p1. Global voltage ramp $V_{ramp}$ is connected to the input side of $C_s$ via a switch 46 operated with a control signal p2.

As shown in FIG. 4b, during the sampling phase, switches 40, 42 and 44 are closed such that $V_{rst}$ is stored on $C_{rst}$, and $V_{in}-V_{rst}$ is stored on $C_s$. Control signals p1 and p1d are preferably arranged such that switch 40 is opened a short delay after switches 42 and 44. Using this "bottom-plate sampling" technique, the signal sampled on $C_s$ is free of the input-dependent charge injection error of switch 40. During the ramping phase, switch 46 is closed, thereby applying $V_{ramp}$ to the input side of $C_s$. As $V_{ramp}$ increases, at some point it exceeds $V_{in}$. Because of charge conservation, at this instant the voltage at node $V_x$ exceeds $V_{rst}$ and the output of A0 toggles. It is noteworthy that at the instant when the comparator fires, its input common-mode voltage is not a function of $V_{in}$ but instead is always at $V_{rst}$. Therefore, the comparator operating point and its propagation delay are always the same, regardless of $V_{in}$.

AC-coupling the input signal and the ramp voltage solves the variable comparator operating point and propagation delay issues present in the DC-coupled arrangement. However, the AC-coupled comparator circuit of FIG. 4a still suffers from several inherent problems. As with the DC-coupled embodiment of FIG. 3, global voltage ramp $V_{ramp}$ is affected by both comparator kickback and capacitive load effects. Another drawback is that the permissible input swing for input voltage $V_{in}$ is limited to approximately Vdd/2, where Vdd is the circuit's supply voltage. This is explained as follows:

With reference to FIG. 4a, the node voltage at the junction of $C_s$ and the comparator is $V_x$. As shown in FIG. 4b, $V_x(t)$ is plotted for minimum and maximum value of $V_{in}$ with a solid and a dotted line, respectively. The minimum value of $V_x$ is reached at the beginning of the ramp and is given by:

$$V_{x,min} = V_{rst} - V_{in,max} + V_{ramp,min}.$$

The maximum value of $V_x$ is reached at the end of the ramp and is given by:

$$V_{x,max} = V_{rst} - V_{in,min} + V_{ramp,max}.$$

Here $V_{in,min}$ and $V_{in,max}$ define the smallest and largest possible values of $V_{in}$, and $V_{ramp,min}$ and $V_{ramp,max}$ define the smallest and largest ramp voltages. Therefore:

$$V_{x,max} - V_{x,min} = (V_{ramp,max} - V_{ramp,min}) + (V_{in,max} - V_{in,min})$$

If $V_{in,max} = V_{ramp,max}$ and $V_{in,min} = V_{ramp,min}$, then $V_{x,max} - V_{x,min} = 2(V_{in,max} - V_{in,min})$.

If during the ramping phase $V_x$ should exceed the supply rails, switch 42 or switch 44 would leak and capacitor $C_s$ would no longer be floating. This would dramatically increase the load on the shared voltage ramp and corrupt it. To prevent this strong crosstalk scenario, one must ensure that $V_{x,max} - V_{x,min} \approx Vdd$. It follows that $V_{in,max} - V_{in,min} \approx Vdd/2$.

SUMMARY OF THE INVENTION

Comparator circuits suitable for use in a column-parallel single-slope analog-to-digital converter are presented which address the problems noted above. Both DC- and AC-coupled comparator circuits are disclosed, which provide benefits that can include low comparator kickback, nearly constant capacitive load on the global voltage ramp, and a large input swing.

The presented comparator circuits comprise a comparator, an input voltage sampling switch, a sampling capacitor arranged to store a voltage which varies with an input voltage when the sampling switch is closed, and a local ramp buffer arranged to buffer the global voltage ramp provided to the comparator circuit. The comparator circuit is arranged such that its output toggles when the buffered global voltage ramp exceeds the stored voltage.

These and other features, aspects, and advantages of the present invention will become better understood with reference to the following drawings, description, and claims.

BRIEF DESCRIPTION OF THE DRAWINGS

FIG. 4b is a timing diagram for the comparator circuit of FIG. 4a.

FIG. 5b is a timing diagram for the comparator circuit of FIG. 5a.

FIG. 6a is a schematic diagram of one possible embodiment of an AC-coupled comparator circuit per the present invention.

FIG. 6b is a timing diagram for the comparator circuit of FIG. 6a.

FIG. 7 is a schematic diagram of another possible embodiment of an AC-coupled comparator circuit per the present invention.

FIG. 9b is a timing diagram for the comparator circuit of FIG. 9a.

FIG. 10 is a block diagram of one possible embodiment of a column-parallel single-slope ADC which includes comparator circuits per the present invention.

DETAILED DESCRIPTION OF THE INVENTION

The present comparator circuit employs 'local ramp buffering'. Each comparator circuit includes a local ramp buffer which receives the global voltage ramp as an input and outputs a buffered voltage ramp for use by the comparator circuit. The local ramp buffers serve to reduce the adverse effects on the global voltage ramp that might otherwise occur due to the operation of the individual comparator circuits.

Figure 5A:
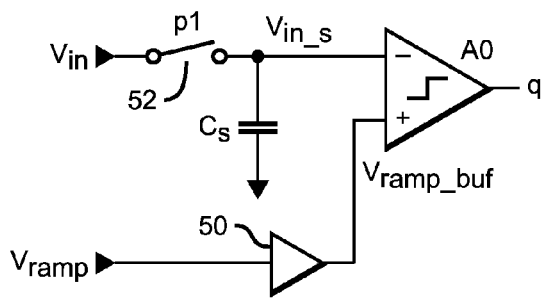
FIG. 5a is a schematic diagram of one possible embodiment of a DC-coupled comparator circuit per the present invention.

One possible embodiment of the present comparator circuit is shown in FIG. 5a, with a corresponding timing diagram shown in FIG. 5b. A DC-coupled arrangement is shown, in which a voltage ramp signal is connected directly to an input of comparator A0. Here, however, rather than connecting global voltage ramp $V_{ramp}$ directly to the comparator, a local ramp buffer 50 is interposed between $V_{ramp}$ and A0: $V_{ramp}$ is connected to the input of buffer 50, and the buffer's output $V_{ramp\_buf}$ is provided to the comparator input. Input voltage $V_{in}$ is coupled to a sampling capacitor $C_s$ via a sampling switch 52 operated with a control signal p1. $V_{in}$ can be any voltage that requires digitizing via the use of a single-slope ADC; in one primary application of the present comparator circuit, $V_{in}$ comes from a column of an image sensor. Local ramp buffer 50 can be implemented as, for example, a source follower, or as a high-gain amplifier placed in unity-gain feedback.

The operation of the circuit shown in FIG. 5a is illustrated in FIG. 5b. Control signal p1 is asserted to briefly close switch 52, thereby sampling $V_{in}$ on capacitor $C_s$; the sampled voltage is labeled as $V_{in\_s}$. The circuit is arranged such that $V_{ramp}$ starts to increase after p1 goes low. The buffered ramp voltage $V_{ramp\_buf}$ increases with $V_{ramp}$ (with a brief propagation delay); if buffer 50 is implemented as a source follower, there will be a voltage offset 54 between $V_{ramp}$ and $V_{ramp\_buf}$. The output q of comparator A0 toggles when $V_{ramp\_buf}$ has increased to the point where it exceeds $V_{in\_s}$.

Several benefits are realized when the comparator circuit is configured and operated as shown in FIGS. 5a and 5b. For example, local ramp buffer 50 serves to reduce comparator kickback to global voltage ramp $V_{ramp}$ at the instant when comparator A0 fires. Buffer 50 also ensures a nearly constant capacitive load on global voltage ramp $V_{ramp}$. The circuit provides a large input signal swing (limited only by the input/output range of the local ramp buffer 50 and the input range of comparator A0). If $V_{in}$ is driven by a source follower circuit, it may be advantageous to also implement local ramp buffer 50 as a source follower, such that the range of $V_{ramp\_buf}$ better matches that of $V_{in}$ prior to the source follower (the offset of the ramp source follower will tend to cancel the offset introduced by the input source follower). Also, the non-linearity of the ramp source follower will tend to cancel the non-linearity of the input source follower.

Note that though FIG. 5a and the subsequent figures are shown with the sampled input voltage being applied to the non-inverting input of comparator A0, this is merely exemplary; the comparator inputs could be reversed and provide the same functionality, with the polarity of output q reversed in this case.

Figure 6B:
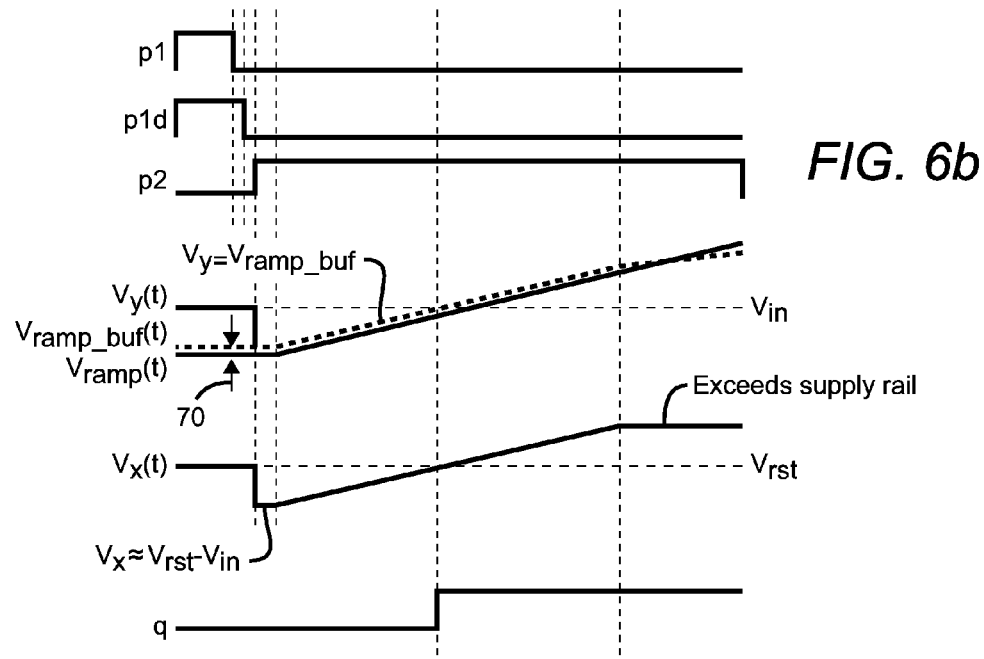

Another possible embodiment of the present comparator circuit is shown in FIG. 6a, with a corresponding timing diagram shown in FIG. 6b. An AC-coupled arrangement is shown, in which the global voltage ramp is AC-coupled to one input of comparator A0 (voltage node $V_x$) via a capacitor and a switch 60 operated with a control signal p2. Here, however, rather than connecting global voltage ramp $V_{ramp}$ directly to switch 60, a local ramp buffer 62 is interposed between $V_{ramp}$ and switch 60: $V_{ramp}$ is connected to the input of buffer 62, and the buffer's output $V_{ramp\_buf}$ is provided to the switch. Input voltage $V_{in}$ is coupled to sampling capacitor $C_s$ via a sampling switch 64 operated with a control signal p1d. A reset capacitor $C_{rst}$ is connected to the other input of comparator A0, which is initialized to a voltage $V_{rst}$ via switches 66 and 68, each of which is operated with a control signal p1. As above, local ramp buffer 62 can be implemented as, for example, a source follower, or as a high-gain amplifier placed in unity-gain feedback.

The operation of the circuit shown in FIG. 6a is illustrated in FIG. 6b. During the sampling phase, switches 64, 66 and 68 are closed such that $V_{rst}$ is stored on $C_{rst}$, and $V_{in}$-$V_{rst}$ is stored on $C_s$. Control signals p1 and p1d are preferably arranged such that switch 64 is opened a short delay after switches 66 and 68. Using this "bottom-plate sampling" technique, the signal sampled on $C_s$ is free of the input-dependent charge injection error of switch 64; bottom-plate sampling can be used effectively with the present comparator circuit, and is preferred. During the ramping phase, switch 60 is closed, thereby applying $V_{ramp\_buf}$ to the input side of $C_s$ (voltage node $V_y$). As $V_{ramp\_buf}$ increases, at some point it exceeds $V_{in}$. Because of charge conservation, at this instant the voltage at node $V_x$ exceeds $V_{rst}$ and the output of A0 toggles. It is noteworthy that at the instant when the comparator output toggles, its input common-mode voltage is not a function of $V_{in}$ but instead is always at $V_{rst}$. Therefore, the comparator operating point and its propagation delay are always the same, regardless of $V_{in}$.

Figure 4A:
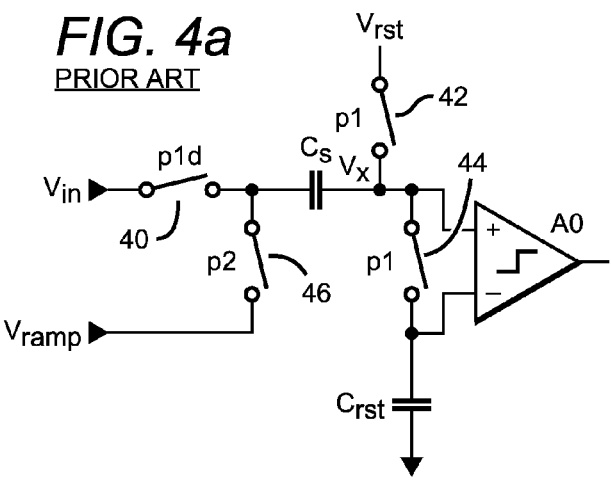
FIG. 4a is a schematic diagram of a known AC-coupled comparator circuit as might be used in a column-parallel single-slope ADC.

The voltage at the input to local ramp buffer 62 ($V_{ramp}$), the voltage at the buffer's output ($V_{ramp\_buf}$), and the voltage at node $V_x$ are plotted in FIG. 6b. One important distinction compared to the prior-art AC-coupled comparator described in FIGS. 4a and 4b, is that it is now permissible for $V_x$ to exceed the supply rail. While this will cause switch 66 or switch 68 to leak and will "ground" the normally floating capacitor $C_s$, this will not matter for two reasons. Firstly, by the time $V_x$ exceeds the supply rail, the comparator has already fired, so the corruption in the value stored on $C_s$ does not matter. Secondly, there will be no change in the load on the shared voltage ramp because of the isolating effect of the local ramp buffer 62. As a result, the voltage $V_{rst}$ can be positioned close to the supply rail and the range of $V_{in}$ is only limited by the range of the local ramp buffer 62. This range is generally much larger than Vdd/2, as in the circuit of FIGS. 4a and 4b.

As with the DC-coupled embodiment in FIG. 5a, local ramp buffer 62 serves to reduce comparator kickback to global voltage ramp $V_{ramp}$ at the instant when comparator A0 fires. Buffer 62 also ensures a nearly constant capacitive load on global voltage ramp $V_{ramp}$. The circuit provides a large input signal swing, now limited only by the range of the local ramp buffer 62. The comparator does not need to have a wide input common-mode range because, at the instant when it fires, its input is at $V_{rst}$, regardless of $V_{in}$. If $V_{in}$ is driven by a source follower circuit, it may be advantageous to also implement local ramp buffer 62 as a source follower, such that the range of $V_{ramp\_buf}$ better matches that of $V_{in}$ prior to the source follower (the offset of the ramp source follower will tend to cancel the offset introduced by the input source follower). Also, the non-linearity of the ramp source follower will tend to cancel the non-linearity of the input source follower. Additional benefits unique to the AC-coupled configuration include: no input-dependent charge injection error during sampling, and a constant comparator operating point, both of which contribute to improved linearity.

A variation of the embodiment shown in FIG. 6a is shown in FIG. 7. Here, there is no reset capacitor $C_{rst}$ or switch 66. Instead, reset voltage $V_{rst}$ is directly connected to the input of comparator A0 (the inverting input in this example), and to the non-inverting input of A0 via switch 68. The timing diagram remains as shown in FIG. 6b, with switch 68 operated by control signal p1. The benefits realized with this configuration are the same as those provided by the embodiment of FIG. 6a. While the embodiment of FIG. 7 is simpler, it requires that the shared reset voltage $V_{rst}$ remain steady during the entire ramping phase. This poses an increased risk of crosstalk through $V_{rst}$—the firing of one or more comparators may disturb $V_{rst}$ and affect the operation of the remaining comparators.

Figure 8:
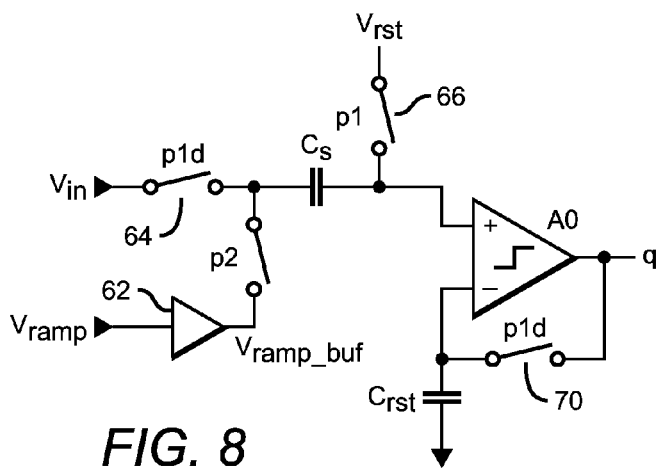
FIG. 8 is a schematic diagram of one possible embodiment of an AC-coupled comparator circuit per the present invention, which includes an autozeroing function.

Another possible AC-coupled embodiment is shown in FIG. 8. Here, autozeroing is employed to cancel any offset associated with comparator A0. This is accomplished by including reset capacitor $C_{rst}$ as shown in FIG. 6a and adding a switch 70 between the output of A0 and $C_{rst}$; switch 68 is not required in this configuration. The timing diagram remains as shown in FIG. 6b, with switch 70 operated by control signal p1d. In addition to the benefits provided by the embodiment of FIG. 6a, the embodiment of FIG. 8 also serves to cancel comparator offset and to suppress 1/f (flicker) noise. A drawback is that the comparator A0 must be unity-gain stable when switch 70 is closed. Also, the comparator thermal noise will be stored on $C_{rst}$ when switch 70 is closed. Depending on whether 1/f or thermal noise is more dominant, the overall circuit noise may be lower or higher than the circuit of FIG. 6a.

Figure 9A:
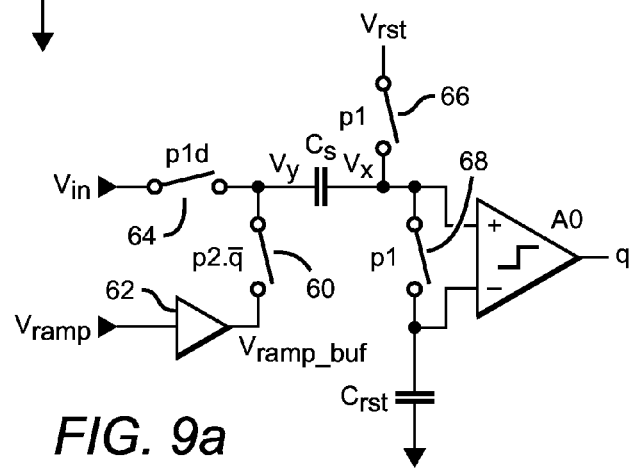
FIG. 9a is a schematic diagram of another possible embodiment of an AC-coupled comparator circuit per the present invention.

FIG. 9a shows an embodiment that prevents node $V_x$ from exceeding the supply voltage and avoids the resulting leakage through the reset switches and grounding of the sampling capacitor. The accompanying timing diagram is shown in FIG. 9b. The configuration is the same as that shown in FIG. 6a, except that here, the switch 60 connected between $V_{ramp\_buf}$ and voltage node $V_y$ is operated with a control signal p2.$\bar{q}$, i.e. the logic AND of p2 and the inverse of the comparator output q. As seen in FIG. 6b, p2.$\bar{q}$ toggles high along with p2, causing $V_{ramp\_buf}$ to be applied to voltage node $V_y$. But when the comparator output toggles high to indicate that $V_{ramp\_buf}$ exceeds $V_{in}$, p2.$\bar{q}$ goes low and switch 60 disconnects $V_{ramp\_buf}$ from voltage node $V_y$. As shown in FIG. 9b, this prevents node $V_y$ from rising higher than $V_{in}$ and node $V_x$ from rising higher than $V_{rst}$. Similar to the circuit of FIG. 6a, the circuit of FIG. 9a has a maximum input range limited only by the input-output range of the local ramp buffer 62.

As shown in FIG. 10, an ADC which includes a comparator circuit 80, 82, 84 as described herein would typically include a local counter 86, 88, 90 which begins counting when the global voltage ramp $V_{ramp}$ (generated by a ramp generator 92) begins ramping, and stops counting when the output of the comparator toggles to indicate that $V_{ramp\_buf}$ exceeds the sampled input voltage, such that the resulting count is a digital representation of the magnitude of input voltage $V_{in}$.

Figure 11:
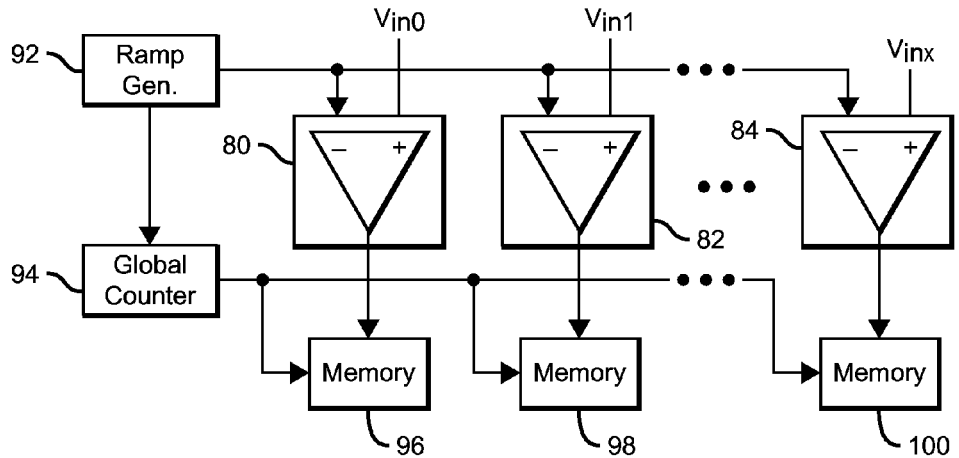
FIG. 11 is a block diagram of another possible embodiment of a column-parallel single-slope ADC which includes comparator circuits per the present invention.

Alternatively, as shown in FIG. 11, instead of a local counter for each comparator, a single global counter 94, whose value is distributed to the ADC columns, can be employed. The global counter begins counting when $V_{ramp}$ begins ramping. Then, each column would include local memory 96, 98, 100 arranged to store the global counter's count at the instant when the output of its comparator toggles to indicate that $V_{ramp\_buf}$ exceeds the sampled input voltage, such that the resulting stored count is a digital representation of the magnitude of $V_{in}$.

In general, the present comparator circuit makes possible high-performance column-parallel single-slope ADCs with large input swing, low noise and power, and good linearity. A large comparator input swing has several benefits. For example, it enables the ADC to accept the full voltage swing from the pixel. This makes possible the use of pixels with a large voltage swing, which require a smaller integrating capacitor for the same charge capacity. A smaller integrating capacitor results in lower input-referred noise (in electrons). Also, a large comparator input swing means that for the same ADC noise (in µV), the output ADC noise (in LSB) is lower.

Figure 1:
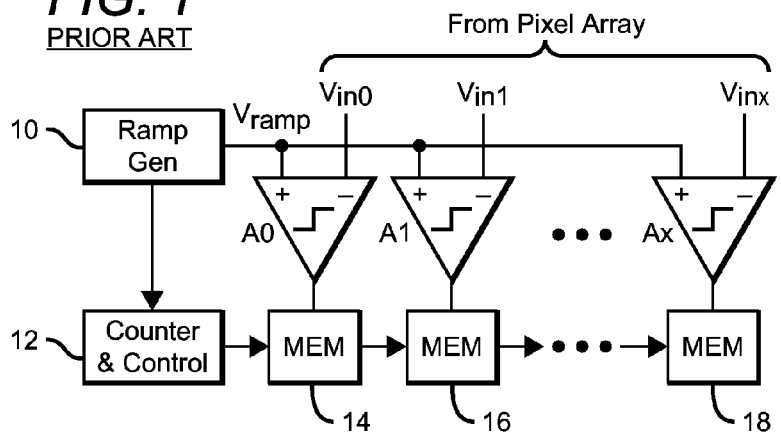
FIG. 1 is a block diagram of a known column-parallel single-slope ADC.
Figure 2:
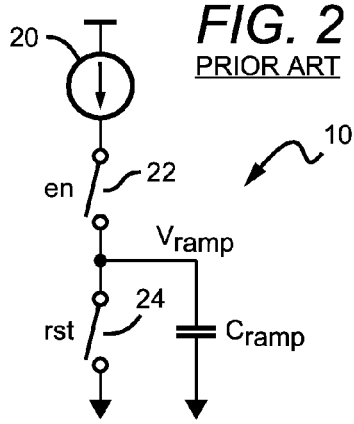
FIG. 2 is a schematic diagram of a known ramp generator.
Figure 3:
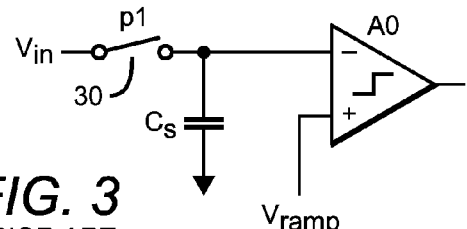
FIG. 3 is a schematic diagram of a known DC-coupled comparator circuit as might be used in a column-parallel single-slope ADC.
Figure 12A:
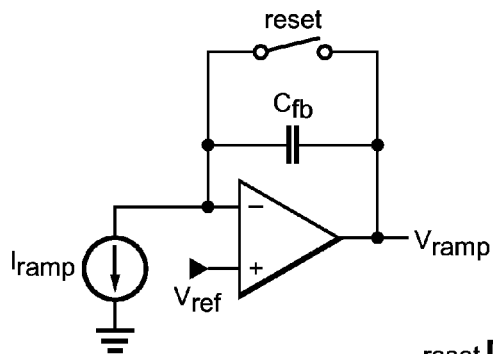
FIGS. 12a and 13a are schematic diagrams of CTIA-based ramp generators which generate ramps having positive and negative slopes, respectively.
Figure 12B:
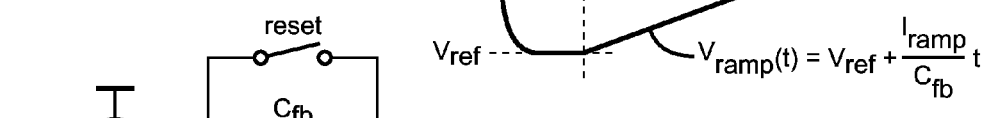
FIGS. 12b and 13b are timing diagrams illustrating the operation of the CTIA-based ramp generators shown in FIGS. 12a and 13a, respectively.
Figure 13A:
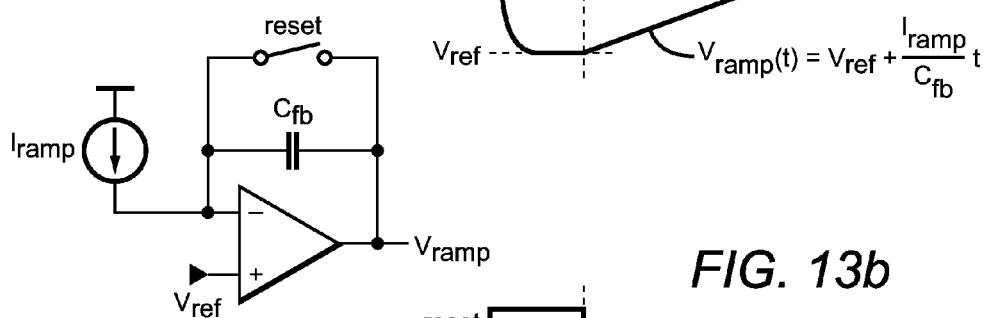
Figure 13B:
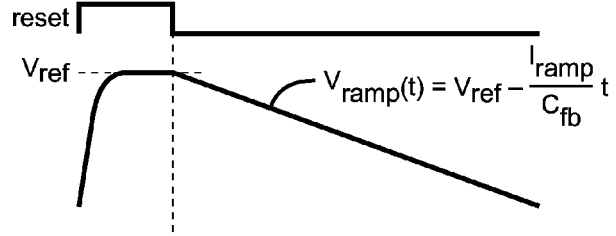

A constant capacitive load and low comparator kickback on the global voltage ramp also provide several benefits. For example, a constant capacitive load enables the ramp to be generated without the need for a buffer, using a constant current source flowing into a large capacitor (as shown in FIG. 2). This simple solution has the benefit of low noise, low power and good linearity. Alternatively, the ramp could be generated by flowing a constant current into, or out of, the inverting input of a capacitive trans-impedance amplifier (CTIA). In this case, the constant capacitive load and low comparator kickback would simplify the CTIA amplifier design in terms of speed and output impedance. Examples of CTIA-based ramp generators which generate ramps with a positive slope and a negative slope are shown in FIGS. 12a and 13a, respectively, with accompanying timing diagrams shown in FIGS. 12b and 13b. Other methods of generating a ramp voltage that are more tolerant of a varying capacitive load often require a high-speed low-impedance buffer and are likely to consume more power and have higher noise.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A comparator circuit suitable for use in a column-parallel single-slope analog-to-digital converter, said comparator circuit comprising:
    an input node;
    a comparator;
    an input voltage sampling switch coupled to said input node;
    a sampling capacitor arranged to store a voltage which varies with an input voltage applied to said input node when said sampling switch is closed; and
    a local ramp buffer having an associated input and arranged to buffer a global voltage ramp applied directly to said local ramp buffer's input;
    said comparator circuit arranged such that the output of said comparator toggles when said buffered global voltage ramp exceeds said stored voltage.

2. The comparator circuit of claim 1, wherein said stored voltage is applied at a first input terminal of said comparator and said buffered global voltage ramp is applied at said comparator's second input terminal.

3. The comparator circuit of claim 2, wherein said sampling capacitor is connected between said comparator's first input terminal and a circuit common point and said sampling switch is connected between said input voltage and said comparator's first input terminal.

4. The comparator circuit of claim 3, said comparator circuit arranged to receive timing signals which operate said sampling switch such that said voltage is stored on said sampling capacitor before said global voltage ramp starts to ramp.

5. The comparator circuit of claim 1, wherein said local ramp buffer is a source follower circuit.

6. The comparator circuit of claim 1, wherein said local ramp buffer is a high-gain amplifier employing unity gain feedback.

7. The comparator circuit of claim 1, further comprising a global voltage ramp generator which generates said global voltage ramp.

8. A comparator circuit suitable for use in a column-parallel single-slope analog-to-digital converter, said comparator circuit comprising:
    an input node;
    a comparator;
    an input voltage sampling switch coupled to said input node;
    a sampling capacitor arranged to store a voltage which varies with an input voltage applied to said input node when said sampling switch is closed; and
    a local ramp buffer having an associated input and arranged to buffer a global voltage ramp applied at said local ramp buffer's input, said comparator circuit arranged such that the output of said comparator toggles when said buffered global voltage ramp exceeds said stored voltage; and
    circuitry arranged to apply a reset voltage to a first input terminal of said comparator;
    said sampling capacitor connected in series between said sampling switch and a second input terminal of said comparator; and
    said buffered global voltage ramp switchably connected to the junction of said sampling capacitor and said sampling switch.

9. The comparator circuit of claim 8, wherein said circuitry comprises:
    a first reset switch arranged to apply said reset voltage to said comparator's second input terminal when closed;
    a second reset switch arranged to connect said comparator's second input terminal to said comparator's first input terminal when closed; and
    a reset capacitor connected between said comparator's first input terminal and a circuit common point.

10. The comparator circuit of claim 9, further comprising:
    a voltage ramp switch connected to apply said buffered global voltage ramp to the junction of said sampling capacitor and said sampling switch when closed;
    said comparator circuit arranged to:
        close said first and second reset switches to apply said reset voltage to said comparator's first and second input terminals;
        close said sampling switch to apply said input voltage to said sampling capacitor;
        open said first and second reset switches and said sampling switch; and
        close said voltage ramp switch to apply said buffered global voltage ramp to the junction of said sampling capacitor and said sampling switch.

11. The comparator circuit of claim 10, wherein said step of opening said first and second reset switches and said sampling switch comprises opening said sampling switch after said first and second reset switches are opened.

12. The comparator circuit of claim 8, wherein said circuitry comprises a reset switch connected between said comparator's first and second input terminals, said reset voltage connected directly to said comparator's first input terminal.

13. The comparator circuit of claim 12, further comprising:
a voltage ramp switch connected to apply said buffered global voltage ramp to the junction of said sampling capacitor and said sampling switch when closed;
said comparator circuit arranged to:
close said reset switch to apply said reset voltage to said comparator's second input terminal;
close said sampling switch to apply said input voltage to said sampling capacitor;
open said reset switch and said sampling switch; and
close said voltage ramp switch to apply said buffered global voltage ramp to the junction of said sampling capacitor and said sampling switch.

14. The comparator circuit of claim 13, wherein said step of opening said reset switch and said sampling switch comprises opening said sampling switch after said reset switch is opened.

15. The comparator circuit of claim 8, wherein said circuitry comprises:
a first reset switch arranged to apply said reset voltage to said second terminal when closed;
a second reset switch connected between said comparator's first input terminal and the output of said comparator; and
a reset capacitor connected between said comparator's first input terminal and a circuit common point.

16. The comparator circuit of claim 15, further comprising:
a voltage ramp switch connected to apply said buffered global voltage ramp to the junction of said sampling capacitor and said sampling switch when closed;
said comparator circuit arranged to:
close said first reset switch to apply said reset voltage to said comparator's second input terminal;
close said second reset switch to connect the output of said comparator to said reset capacitor;
close said sampling switch to apply said input voltage to said sampling capacitor;
open said first and second reset switches and said sampling switch; and
close said voltage ramp switch to apply said buffered global voltage ramp to the junction of said sampling capacitor and said sampling switch.

17. The comparator circuit of claim 16, wherein said step of opening said first and second reset switches and said sampling switch comprises opening said sampling switch after said first and second reset switches are opened.

18. The comparator circuit of claim 8, further comprising a voltage ramp switch connected to apply said buffered global voltage ramp to the junction of said sampling capacitor and said sampling switch when closed;
said comparator circuit arranged to:
close said voltage ramp switch to apply said buffered global voltage ramp to the junction of said sampling capacitor and said sampling switch; and
open said voltage ramp switch when the output of said comparator toggles to indicate that said buffered global voltage ramp exceeds said stored voltage.

19. A comparator circuit suitable for use in a column-parallel single-slope analog-to-digital converter, said comparator circuit comprising:
an input node;
a comparator;
an input voltage sampling switch coupled to said input node;
a sampling capacitor arranged to store a voltage which varies with an input voltage applied to said input node when said sampling switch is closed;
a local ramp buffer having an associated input and arranged to buffer a global voltage ramp applied at said local ramp buffer's input, said comparator circuit arranged such that the output of said comparator toggles when said buffered global voltage ramp exceeds said stored voltage;
a global voltage ramp generator which generates said global voltage ramp, wherein said global voltage ramp generator comprises:
a constant current source;
an enable switch connected between the output of said constant current source and an output node at which said global voltage ramp is provided;
a capacitor connected between said output node and a circuit common point; and
a reset switch connected between said output node and said circuit common point;
such that the voltage across said capacitor grows linearly when said enable switch is closed and said reset switch is open, and the voltage across said capacitor is reset to the potential at said circuit common point when said enable switch is open and said reset switch is closed.

20. A comparator circuit suitable for use in a column-parallel single-slope analog-to-digital converter, said comparator circuit comprising:
an input node;
a comparator;
an input voltage sampling switch coupled to said input node;
a sampling capacitor arranged to store a voltage which varies with an input voltage applied to said input node when said sampling switch is closed;
a local ramp buffer having an associated input and arranged to buffer a global voltage ramp applied at said local ramp buffer's input, said comparator circuit arranged such that the output of said comparator toggles when said buffered global voltage ramp exceeds said stored voltage;
a global voltage ramp generator which generates said global voltage ramp, wherein said global voltage ramp generator comprises:
a constant current source; and
a capacitive trans-impedance amplifier (CTIA);
said ramp generator arranged such that the output of said constant current source flows either into or out of the inverting input of said CTIA such that said global voltage ramp is produced at the output of said CTIA.

21. A comparator circuit suitable for use in a column-parallel single-slope analog-to-digital converter, said comparator circuit comprising:
an input node;
a comparator;
an input voltage sampling switch coupled to said input node;
a sampling capacitor arranged to store a voltage which varies with an input voltage applied to said input node when said sampling switch is closed;
a local ramp buffer having an associated input and arranged to buffer a global voltage ramp applied at said local ramp buffer's input, said comparator circuit arranged such that the output of said comparator toggles when said buffered global voltage ramp exceeds said stored voltage; and
a local counter which begins counting when said voltage ramp signal begins ramping and stops counting when the output of said comparator toggles to indicate that said buffered global voltage ramp exceeds said stored voltage, such that the resulting count is a digital representation of the magnitude of said input voltage.

22. A comparator circuit suitable for use in a column-parallel single-slope analog-to-digital converter, said comparator circuit comprising:
an input node;
a comparator;
an input voltage sampling switch coupled to said input node;
a sampling capacitor arranged to store a voltage which varies with an input voltage applied to said input node when said sampling switch is closed;
a local ramp buffer having an associated input and arranged to buffer a global voltage ramp applied at said local ramp buffer's input, said comparator circuit arranged such that the output of said comparator toggles when said buffered global voltage ramp exceeds said stored voltage; and
a global counter which begins counting when said voltage ramp signal begins ramping, said circuit further arranged to store said global counter's count in local memory when the output of said comparator toggles to indicate that said buffered global voltage ramp exceeds said stored voltage, such that the resulting count is a digital representation of the magnitude of said input voltage.

23. A comparator circuit suitable for use in a column-parallel single-slope analog-to-digital converter, said comparator circuit comprising:
an input node;
a comparator having first and second input terminals;
an input voltage sampling switch coupled to said input node which receives an input voltage;
a sampling capacitor connected between said comparator's first input terminal and a circuit common point and arranged to store said input voltage when said sampling switch is closed; and
a local ramp buffer having an associated input and arranged to buffer a global voltage ramp applied directly to said local ramp buffer's input, said buffered global voltage ramp applied at said comparator's second input terminal;
said comparator circuit arranged to receive timing signals which operate said sampling switch such that said voltage is stored on said sampling capacitor before said global voltage ramp starts to ramp;
said comparator circuit arranged such that the output of said comparator toggles when said buffered global voltage ramp exceeds said stored voltage.

24. A comparator circuit suitable for use in a column-parallel single-slope analog-to-digital converter, said comparator circuit comprising:
a comparator having first and second input terminals;
an input voltage sampling switch which receives an input voltage;
a sampling capacitor connected between said input voltage sampling switch and said comparator's first input terminal and arranged to store a voltage which varies with said input voltage when said sampling switch is closed;
a reset capacitor connected between said comparator's second input terminal and a circuit common point;
a first reset switch arranged to apply a reset voltage to said comparator's first input terminal when closed, and a second reset switch arranged to connect said comparator's second input terminal to its first input terminal when closed;
a local ramp buffer arranged to buffer a global voltage ramp applied at an input; and
a voltage ramp switch connected to apply said buffered global voltage ramp to the junction of said sampling capacitor and said sampling switch when closed;
said comparator circuit arranged to:
close said first and second reset switches to apply said reset voltage to said comparator's first and second input terminals;
close said sampling switch to apply said input voltage to said sampling capacitor;
open said first and second reset switches and said sampling switch; and
close said voltage ramp switch to apply said buffered global voltage ramp to the junction of said sampling capacitor and said sampling switch;
said comparator circuit arranged such that the output of said comparator toggles when said buffered global voltage ramp exceeds said stored voltage.

25. The comparator circuit of claim 24, wherein said step of opening said first and second reset switches and said sampling switch comprises opening said sampling switch after said first and second reset switches are opened.

26. A comparator circuit suitable for use in a column-parallel single-slope analog-to-digital converter, said comparator circuit comprising:
a comparator having first and second input terminals;
an input voltage sampling switch which receives an input voltage;
a sampling capacitor connected between said input voltage sampling switch and said comparator's first input terminal and arranged to store a voltage which varies with said input voltage when said sampling switch is closed;
a reset voltage applied to said second terminal;
a reset switch connected between said first terminal and said second terminal;
a local ramp buffer arranged to buffer a global voltage ramp applied at an input; and
a voltage ramp switch connected to apply said buffered global voltage ramp to the junction of said sampling capacitor and said sampling switch when closed;
said comparator circuit arranged to:
close said reset switch to apply said reset voltage to said comparator's first input terminal;
close said sampling switch to apply said input voltage to said sampling capacitor;
open said reset switch and said sampling switch; and
close said voltage ramp switch to apply said buffered global voltage ramp to the junction of said sampling capacitor and said sampling switch;
said comparator circuit arranged such that the output of said comparator toggles when said buffered global voltage ramp exceeds said stored voltage.

27. The comparator circuit of claim 26, wherein said step of opening said reset switch and said sampling switch comprises opening said sampling switch after said reset switch is opened.

28. A comparator circuit suitable for use in a column-parallel single-slope analog-to-digital converter, said comparator circuit comprising:
a comparator having first and second input terminals;
an input voltage sampling switch which receives an input voltage;
a sampling capacitor connected between said input voltage sampling switch and said comparator's first input terminal and arranged to store a voltage which varies with said input voltage when said sampling switch is closed;

a first reset switch arranged to apply a reset voltage to said first terminal when closed;

a second reset switch connected between said comparator's second input terminal and the output of said comparator;

a reset capacitor connected between said comparator's second input terminal and a circuit common point;

a local ramp buffer arranged to buffer a global voltage ramp applied at an input; and a voltage ramp switch connected to apply said buffered global voltage ramp to the junction of said sampling capacitor and said sampling switch when closed;

said comparator circuit arranged to:
close said first reset switch to apply said reset voltage to said comparator's first input terminal;
close said second reset switch to connect the output of said comparator to said reset capacitor;
close said sampling switch to apply said input voltage to said sampling capacitor;
open said first and second reset switches and said sampling switch; and
close said voltage ramp switch to apply said buffered global voltage ramp to the junction of said sampling capacitor and said sampling switch;

said comparator circuit arranged such that the output of said comparator toggles when said buffered global voltage ramp exceeds said stored voltage.

29. The comparator circuit of claim 28, wherein said step of opening said first and second reset switches and said sampling switch comprises opening said sampling switch after said first and second reset switches are opened.

30. A column-parallel single-slope analog-to-digital converter (ADC), said ADC comprising:
a plurality of comparator circuits, each of which comprises:
an input node;
a comparator;
an input voltage sampling switch coupled to said input node;
a sampling capacitor arranged to store a voltage which varies with an input voltage when said sampling switch is closed; and
a local ramp buffer having an associated input and arranged to buffer a global voltage ramp applied directly to said input;
said comparator circuit arranged such that the output of said comparator toggles when said buffered global voltage ramp exceeds said stored voltage;
each of said comparator circuits receiving its input voltage from a respective pixel array column; and
a voltage ramp generator which generates said global voltage ramp which is provided to each of said comparator circuits.

* * * * *